US00RE34428E

United States Patent [19]

George et al.

[11] E Patent Number: Re. 34,428

[45] Reissued Date of Patent: Nov. 2, 1993

[54] ANALOG-TO-DIGITAL CONVERTER WITH OFFSET VOLTAGE POLARITY INVERSION

[75] Inventors: Richard E. George; A. Brinkley Barr, both of Everett; Thomas W. Wiesmann, deceased, late of Lynnwood, all of Wash., by Richard E. George, A. Brinkley Barr, executors

[73] Assignee: John Fluke Mfg. Co., Inc., Everett, Mich.

[21] Appl. No.: 846,442

[22] Filed: Mar. 6, 1992

Related U.S. Patent Documents

Reissue of:

[64] Patent No.: 4,906,996
Issued: Mar. 6, 1990
Appl. No.: 278,878
Filed: Dec. 2, 1988

[51] Int. Cl.[5] ..... H03M 1/06

[52] U.S. Cl. ..... 341/118; 341/129; 341/167

[58] Field of Search ..... 341/128, 129, 118, 166, 341/167, 168

[56] References Cited

U.S. PATENT DOCUMENTS

| | | | |
|---|---|---|---|
| 4,195,283 | 3/1980 | Ishikawa | 341/118 |
| 4,243,975 | 1/1981 | Masuda et al. | 341/168 |
| 4,309,692 | 1/1982 | Crosby | 341/129 |
| 4,315,253 | 2/1982 | Tytus | 341/118 |
| 4,556,867 | 12/1985 | George | 341/118 |
| 4,633,233 | 12/1986 | Serderowicz | 341/118 |
| 4,764,752 | 8/1988 | Ormond | 341/167 |
| 4,764,753 | 8/1988 | Yukawa | 341/155 |

FOREIGN PATENT DOCUMENTS

| | | | |
|---|---|---|---|
| 2752560 | 5/1979 | Fed. Rep. of Germany . | |
| 2932371 | 2/1981 | Fed. Rep. of Germany | 341/128 |

*Primary Examiner*—Howard L. Williams
*Attorney, Agent, or Firm*—Edward J. Wise; Michael J. Strauss; Robert E. Leblanc

[57] ABSTRACT

There is provided according to the invention a method and apparatus for eliminating or minimizing the error due to amplifier offset or drift error in an integrating dual slope analog-to-digital converter. The converter is provided with a switching and control arrangement whereby the integrating capacitor is charged for one-half of the predetermined charging time as a function of the sum of the levels of the unknown signal and the error signal. The integrating capacitor is charged for the remaining half of the predetermined time period as a function of the difference of the levels of the unknown signal and the error signal so that the capacitor reaches a level of charge which is a function of the level of the unknown signal substantially unaffected by the level of the error signal. During deintegration of the capacitor by a reference signal the polarity of the error signal is inverted during successive or consecutive deintegration cycles so that the error voltage is self-cancelling in two successive deintegrations and is eliminated from the summed digital output.

17 Claims, 5 Drawing Sheets

ANALOG-TO-DIGITAL CONVERTER WITH OFFSET VOLTAGE POLARITY INVERSION

Matter enclosed in heavy brackets [ ] appears in the original patent but forms no part of this reissue specification; matter printed in italics indicates the additions made by reissue.

TECHNICAL FIELD

This invention is directed to integrating analog-to-digital (A/D) converters and more particularly to dual slope A/D converters having an improved arrangement for offset or correction and to methods of corrected A/D conversion by integration.

BACKGROUND ART

Dual slope A/D converters designed to achieve optimum conversion accuracy have required and have incorporated arrangements for providing offset and drift voltage correction. A representative drift compensated circuit is described in U.S. Pat. No. 3,654,560 issued Apr. 4, 1972 to Cath et al. That patent describes a "rezero" or autozero state during which a feedback loop is closed around a storage capacitor provided for correction purposes. Considerable care is required to properly charge the storage capacitor to an accurate offset level since noise, loop instability, settling time effects, leakage, and capacitor anomalies can all detrimentally affect conversion accuracy.

DISCLOSURE OF THE INVENTION

The invention may be utilized with an integrating resistor and capacitor and high gain integrating amplifier arranged to integrate an unknown analog signal for a predetermined period of time. As is customary with such arrangements there is an offset error signal associated with the amplifier. According to the invention a switching and control means is provided so that the integrating capacitor is charged for substantially one-half of the predetermined time period with a current which is a function of the level of the analog signal and the level of the error signal. The capacitor is then charged for the remainder of such predetermined time period with a current which is a function of the level of the analog signal and the invert of the level of the error signal so that the capacitor reaches a level of charge which is a function of the level of the analog signal substantially unaffected by the level of the error signal. The net effect of integrating over the cumulative predetermined time period comprised of the two halves is that the total charge placed on the integrating capacitor is identical to the charge which would be present if the offset or error voltage had been zero. That is, the net effect of the offset or error voltage is self-cancelling and the need for the previously conventional corrective storage capacitor is eliminated.

In the conventional dual slope analog-to-digital converter the integrated charge on the capacitor is generally converted to a digital signal by generating a digital output which is a function of the time required to de-integrate the capacitor in response to the application of a reference signal or voltage. This reference integration or de-integration is also subject to error as a result of the existence of the offset or error voltage associated with the amplifier. According to another feature of the present invention this error is eliminated in a digital fashion through a switching and control arrangement which inverts the polarity of the error signal during successive or consecutive de-integration cycles so that the error voltage is self-cancelling in two consecutive de-integrations of the capacitor and is eliminated from the summed digital output count. While a summed digital output signal is preferred according to the invention the error is also eliminated with respect to the average of two consecutive counts.

The unique features of the invention may be implemented by various circuitry arrangements. Thus according to one embodiment of the invention the polarity of the error signal during the charge cycle may be inverted by inverting the inputs of the integrator amplifier while simultaneously inverting its output. This reversal of polarity occurs at the midpoint of the capacitor charging time period. The reversed polarity may be allowed to remain through de-integration and the first half of the next charge cycle. Re-reversal then occurs to return the polarity to the initial status through the second half of the second charging cycle and through the second de-integration. The error voltage thus cancels itself during both integration cycles and cancels itself from the sum or the average of the de-integration cycles.

The inventive arrangement may also be implemented in a circuit such as previously described but wherein a high impedance buffer amplifier is connected between the analog signal input and the input to the integration amplifier. According to this second embodiment of the invention the desired cancelling reversal is achieved by a switching and control arrangement which has the effect of interchanging the integrating and buffer amplifiers at the time of reversal as above described. Still a further circuit arrangement for implementing the invention involves switching and control circuitry for reversing the connections between the integration amplifier and the integration capacitor.

It is accordingly an object of the invention to provide an improved method and apparatus for performing dual slope analog-to-digital conversion with self-cancellation of amplifier offset error.

It is another object of the invention to provide an improved method and apparatus for performing dual slope analog-to-digital conversion wherein error signals are eliminated or minimized in a digital fashion.

BRIEF DESCRIPTION OF DRAWINGS

The foregoing objects and advantages of the invention will become more readily apparent upon reference to the following specifications claims and drawings wherein:

BEST MODE FOR CARRYING OUR THE INVENTION

Figure 1:
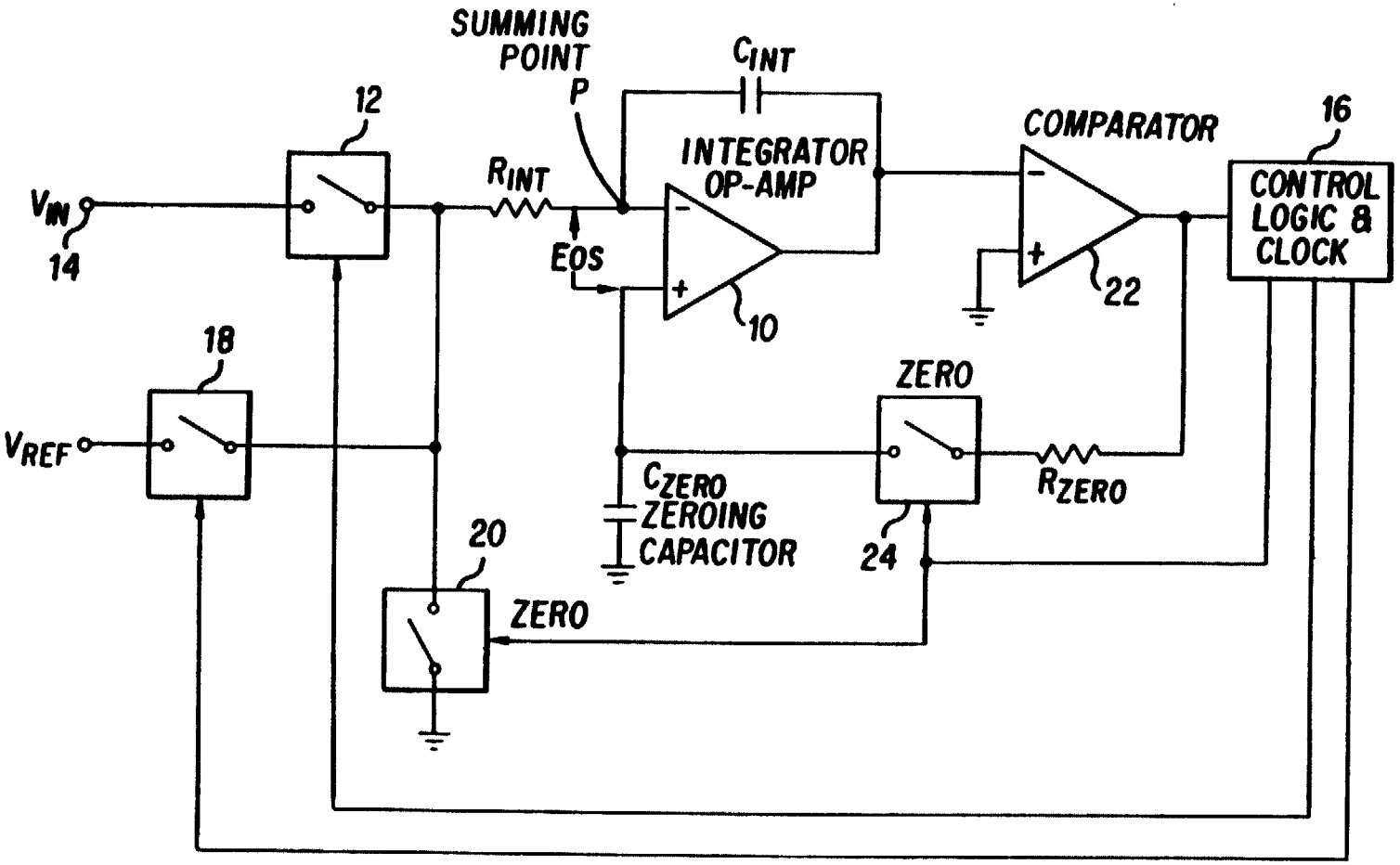
PRIOR ART FIG. 1
FIG. 1 is a simplified schematic diagram of a dual slope analog to digital converter having conventional offset correction circuitry.

The improved offset corrected dual slope A/D converter of the invention is better understood in comparison to the construction and operation and limitation of conventional dual slope A/D converters with offset correction. Accordingly a brief description of such a conventional converter or sensor is first provided. Attention is directed to FIG. 1 which illustrates in basic schematic form a known dual slope A/D offset corrected convertor of the general type disclosed in aforementioned U.S. Pat. No. 3,654,560.

Referring to FIG. 1 there is shown a dual slope A/D converter comprising an integrator operational amplifier ("Op-Amp") 10 having an integrating capacitor $C_{INT}$ connected between the output of the amplifier 10 and the Summing Point P located at the inverting input of the amplifier. The Summing Point P is connected through the integrating resistor $R_{INT}$ and through integrate switch 12 to an input terminal 14 for connection to an unknown voltage $V_{IN}$ to be measured. The switch 12 is shown for purposes of simplicity as a simple electromechanical switch. It will be understood that in a commercial embodiment it would normally take the form of an electronic switch controllable by a suitable control source such as the control logic and clock indicated at 16. The integrate resistor $R_{INT}$ is also connected through a suitable reference voltage integrate switch 18 to a reference voltage source indicated $V_{REF}$. The reference integrate switch 18 is also controlled by the control logic 16. The junction of the connection to the integrate resistor $R_{INT}$ and the reference integrate switch 18 is connected to a comparator zero or autozero switch indicated at 20. This switch also is under control of the control logic 16.

The output of the integrator Op-Amp 10 is fed to the inverting input of a comparator or level crossing detector 22 which has a non-inverting input connecting to ground. The output of the comparator 22 is fed to the control logic 16 for controlling the production of a digital output signal such as by a digital display or readout in a conventional manner not shown in FIG. 1. The output of the comparator is further connected through a zeroing resistor $R_{ZERO}$ and a zero switch 24 to a zeroing capacitor $C_{ZERO}$. The capacitor $C_{ZERO}$ is connected between the non-inverting input of the integrator amplifier 10 and common or ground. The zero switch 24 is controlled by the control logic 16 as will be understood.

The zeroing capacitor $C_{ZERO}$, zero switch 24 and zero resistor $R_{ZERO}$ is utilized to correct for zero offset voltages of the integrator amplifier 10 and any buffer amplifier (not shown) during autozeroing. During such action the zeroing capacitor $C_{ZERO}$ is placed in a closed loop around the integrator amplifier and comparator and charges to the appropriate offset voltage. During the autozero operation the two zeroing switches 20 and 24 are closed. The input to the integrator resistor $R_{INT}$ is grounded through switch 20. The offset voltage to compensate for the offset of the comparator amplifier 22 is stored on the integrating capacitor $C_{INT}$, and the offset voltage to compensate for the offset of the integrator amplifier is stored on the zeroing capacitor $C_{ZERO}$. The result is that the summing point P is brought to zero or ground potential during an ideal autozeroing operation.

In practice it is difficult to achieve this ideal situation. It generally takes an appreciable time to store the correct integrator offset voltage because (a) it must be established to be within an error band less than the resolution of the system, and (b) it is subject to the noise in the operational amplifier which conventionally has a high DC gain. Thus, any noise at the input of the device may also be stored on the zeroing capacitor $C_{ZERO}$ so that erroneous storage is possible. This offset correction system is essentially analog in nature and depends on the absolute charge stored on two capacitors. With this arrangement autozero is implemented with two time constants in series, charging the zeroing capacitor $C_{ZERO}$ and the integrate capacitor $C_{INT}$ to store the integrator amplifier offset and comparator offset respectively. Such a use of multiple time constants in series is well recognized as requiring compromises in settling time in order to guarantee loop stability.

The foregoing problems are inherent in the conventional autozeroing arrangement for dual slope A/D converters but are very significantly minimized according to the present invention.

Figure 2:
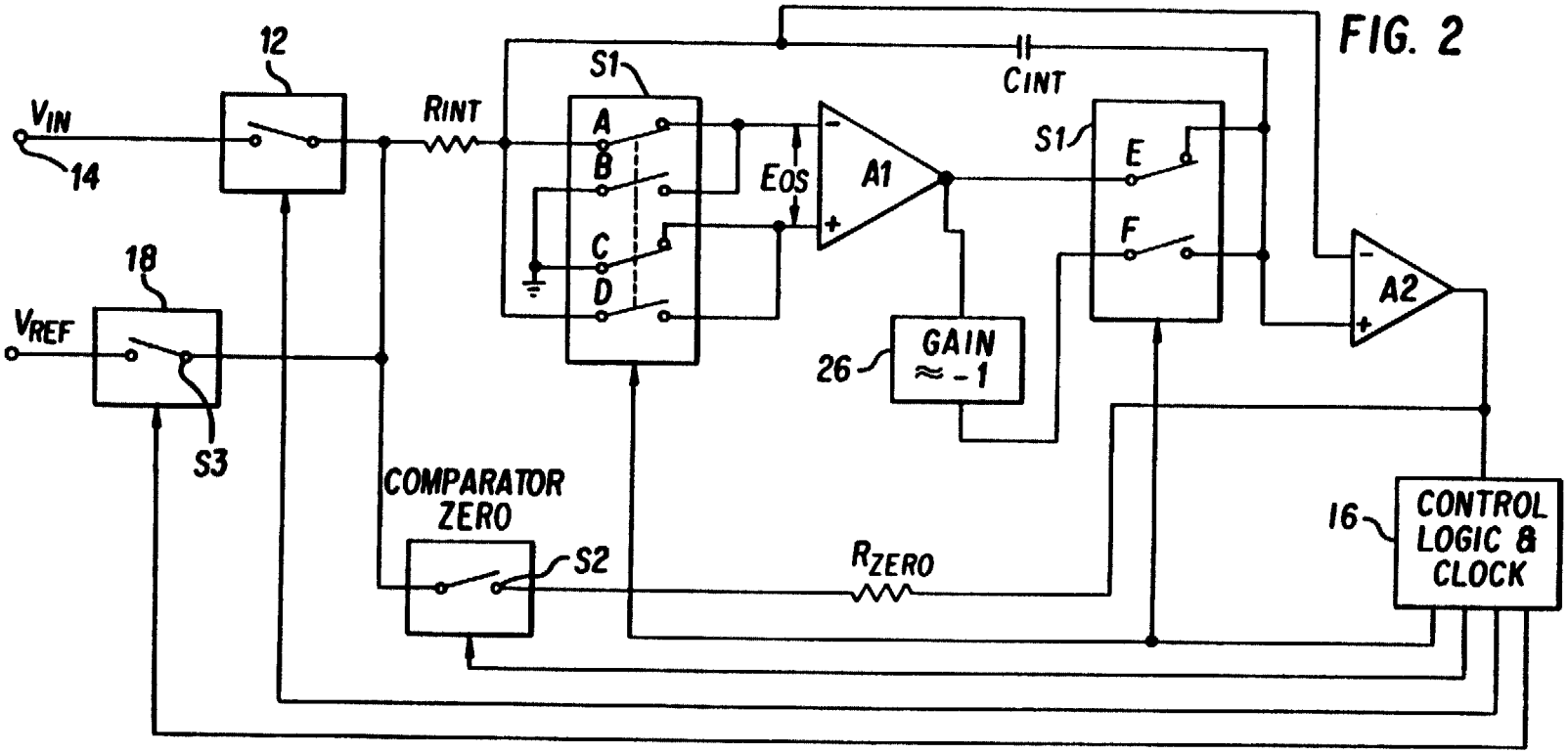
FIG. 2 is a schematic diagram of one embodiment of an A/D converter having an offset correction circuit constructed according to the invention.

Pursuant to the invention the analog charging of an offset capacitor is eliminated through use of a unique digital type error cancellation arrangement. Referring to FIG. 2 one embodiment of the new converter is shown in simplified form in order to illustrate the basic difference from the analog approach illustrated in FIG. 1 as used in the prior art.

Referring to FIG. 2 an integrator amplifier indicated at A1 is arranged to receive input from an unknown voltage terminal 14 through an integrate switch 12 and integrate resistor $R_{INT}$. A reference voltage indicated at $V_{REF}$ is arranged to be connected to the integrator amplifier A1 through a reference integrate switch S3 corresponding to the switch 18 in FIG. 1. The output of the integrator amplifier A1 is connected to a comparator Op-Amp A2 whose output is connected to a control logic and clock circuit indicated at 16 in the same manner as the arrangement of FIG. 1. An integrate capacitor $C_{INT}$ is connected to the integrator resistor $R_{INT}$. The basic differences in circuitry from the conventional arrangement of FIG. 1 are now described.

The converter of the invention shown in FIG. 2 is provided with an offset reverse switch shown for convenience as an electromechanical multiple pole switch S1A through S1F. The switch is controlled by the control logic 16 and is arranged to effectively reverse the polarity of offset which can be attributed to integrator amplifier A1. The switches S1A and S1B are connected to the inverting input of the integrator amplifier A1 while the switches S1C and S1D are connected to the non-inverting input of the amplifier A1. The other side (movable contact) of switch S1A is connected to the integrate resistor $R_{INT}$. The movable contacts of switches S1B and S1C are connected together and to common or ground. The other terminal (movable contact) of switch S1D is connected to the integrate resistor $R_{INT}$. Switch S1E is connected between the output of the integrator amplifier A1 and the inverting input of the comparator Op-Amp A2. Switch S1F has its stationary contact connected to the non-inverting input of comparator A2. The other movable contact of switch S1F is connected to the output of the integrator amplifier A1 through an inverter or Gain −1 operator 26 which serves to invert the output of the integrator amplifier A1. A comparator zeroing loop is shown connected from the output of the comparator A2 through the zeroing resistor $R_{ZERO}$, through comparator zeroing switch S2 and integrate resistor $R_{INT}$. The zeroing switch S2 is controlled by the control logic 16. As it is closed switches 12 and 18 are opened to isolate the comparator zeroing loop from the unknown and reference inputs.

Referring to the offset reverse switch S1, it will be seen that as it is shown in FIG. 2 switch S1A is in its normally closed position, switch S1B is in its normally open position, switch S1C is in its normally closed position and switch S1D is in its normally open position. Referring to switches S1E and S1F, switch S1E is in its normally closed position while switch S1F is in its normally open position. Upon actuation of switch S1 the positions are reversed. In the actuated position switch S1A is open, S1B is closed, S1C is open, S1D is closed, S1E is open and S1F is closed.

The effect of actuating the offset reverse switch S1 is to reverse the connections to the inverting and non-inverting input of the integrator amplifier A1 and to re-route the output of that amplifier through the inverter or Gain −1 stage 26. The purpose of the inverter or Gain −1 stage 26 is to provide a compensating phase inversion at the output of the integrator amplifier A1 to permit its input to be reversed.

Figure 3:
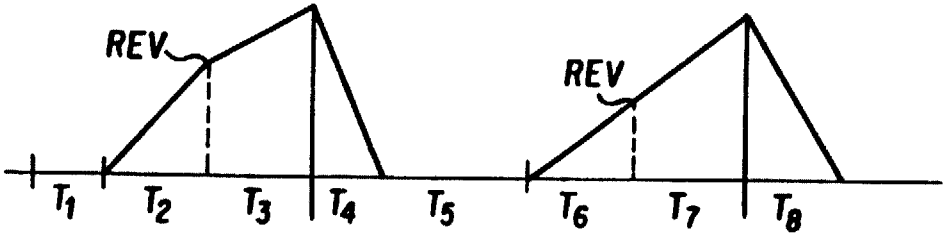
FIG. 3 is a graphic representation of waveforms showing operation of the improved converter.

Referring to FIG. 3 there is an illustration of the waveforms which result from the unique operation of the A/D converter according to the invention. In this Figure the voltage across the integrate capacitor $C_{INT}$ is plotted against time. The time scale is divided into eight segments indicated as $T_1$ through $T_8$ illustrating two cycles or samples. In the timing sequence illustrated in FIG. 3 time period $T_1$ is an initialization period which establishes the comparator zero crossing level. This time period is somewhat analogous to the prior autozero state except that one offset storage capacitor has been eliminated. This time period is used to permit the integrate capacitor $C_{INT}$ to acquire an initial charge equal to the comparator offset through switch S2 which is closed at this time by the control logic 16. The settling time necessary to establish a comparator zero is an order of magnitude shorter than is the settling time of the prior art which relied on a two time constant autozero loop involving an integrator zeroing capacitor in addition to the integrate capacitor. Such conventional operation has been discussed herein in relation to FIG. 1.

Referring to FIG. 3 the first integrate interval $T_2$ starts from the comparator initialization level. During $T_2$ the input $V_{IN}$ applied to the integration resistor $R_{INT}$ through switch 12 is effectively added to the offset $E_{OS}$ of the integrator amplifier A1. For the following discussions of FIGS. 2 and 3, it is assumed that during time interval $T_2$, the closed contacts of switch S1 are as shown in FIG. 2. For the purpose of understanding the slope changes shown in FIG. 3, it is also assumed that $E_{OS}$ causes the A1(−) terminal to be more positive than the A1(+) terminal. During the time period $T_3$ S1 is caused to switch and the offset $E_{OS}$ of amplifier A1 is reversed in polarity effectively causing $E_{OS}$ to be subtracted from $V_{IN}$. The net effect of integrating over the cumulative time periods $T_2$ plus $T_3$ where $T_2$ is equal to $T_3$ is that the total charge placed on the integrating capacitor $C_{INT}$ is identical to that charge which would be present if the offset $E_{OS}$ had been zero. That is, the net effect of the offset potential $E_{OS}$ is zero because it is self-cancelling. The average charging current of the integrate capacitor $C_{INT}$ over periods $T_2$ and $T_3$ is a function of the level of the analog signal $V_{IN}$ substantially unaffected by the level of the offset voltage $E_{OS}$. This addition and subtraction of the integrator amplifier offset voltage EOS to the integrated $V_{IN}$ is illustrated in FIG. 3 by an exaggerated change in slope of the integrated signal for purposes of clarity.

The offset reverse point which occurs at the transition from time period $T_2$ to time period $T_3$ is indicated at REV. As stated, the control is designed so that the reverse point occurs exactly half way through the predetermined integrate cycle established by the controller 16. Thus the integrate capacitor $C_{INT}$ is charged for one-half of the predetermined time period with a current which is a function of the level of the analog signal $V_{IN}$ and the level of the error signal $E_{OS}$. The capacitor $C_{INT}$ is charged for the remainder of the predetermined period with a current which is a function of the level of the analog signal and the invert of the error signal $E_{OS}$ so that the capacitor reaches a level of charge which is a function of the level of the analog signal $V_{IN}$ substantially unaffected by the level of the error signal $E_{OS}$. As is customary with conventional A/D converters, the total integrate time is chosen as a multiple of both 50 and 60 Hz line cycle periods to eliminate power line frequency interference.

Following the conclusion of the integrate time periods $T_2+T_3$ the integration or de-integration of the reference signal $V_{REF}$ occurs as indicated at time period $T_4$. During this reference integrate period the time count of $T_4$ will be in error by the ratio of $E_{OS}$ to $E_{REF}$. At this time the reference integrate switch 18 is closed, the integrate switch 12 is open, and the switches S1B and S1D are closed. Switches S1A and S1C are open. The reverse switch S1 is reversed at the mid cycle of $T_2+T_3$ but is not reversed at the transition between $T_3$ and $T_4$. Thus the same offset $E_{OS}$ is applied during both $T_3$ and $T_4$. This creates the effect of rotating the slope of both the $T_3$ and $T_4$ ramps in a clockwise direction. The change in slope of the $T_3$ ramp is offset by the opposite change in the slope of the ramp during $T_2$. The error which would be caused by this change in the ramp during $T_4$ is eliminated according to the invention as follows.

Following $T_4$ there is an optional hold indicated by $T_5$ to permit maintaining a synchronous system relative to the 50 or 60 Hz line. At the end of the hold period $T_5$ a second sample cycle of integration of $V_{IN}$ commences as indicated at time period $T_6$. During this time the offset voltage $E_{OS}$ is applied in the same direction as during time periods $T_3$ and $T_4$. This is opposite to its polarity during the initial integration time period $T_2$ in the first cycle. At the end of time period $T_6$ the reversing switches S1 are reversed to again reverse the polarity of application of $E_{OS}$. During time period $T_6$ switches S1A, S1C and S1E are open while switches S1B, S1D and S1F are closed. At the commencement of time period $T_7$ and continuing through $T_8$ the switch is reversed so that switches S1A, S1C and S1E are closed and switches S1B, S1D and S1F are open. The slope of the integrate and de-integrate ramps during $T_7$ and $T_8$ are modified accordingly in a counter clockwise direction. The slope of the de-integrate ramp representing the integration of the $V_{REF}$ now defines a time period $T_8$ which is in error by exactly the same amount as previously occurred during $T_4$ but in the opposite direction. As a result the error is cancelled.

The preferred form of analog-to-digital converter of the invention utilizes two minor cycles to provide maximum correction for offset error. This involves summing of at least two cycles and may be advantageously incorporated in the type of summing circuit disclosed in assignee's U.S. Pat. No. 4,556,867 issued Dec. 3, 1985. It will be obvious that cycles in addition to two may be summed and that the resolution of the digital indication will be improved in proportion to the number of cycles summed. Means may be provided for correcting the accumulated total from multiple counts as described in detail in said U.S. Pat. No. 4,556,867.

The effect of this novel methodology and arrangement according to the invention is illustrated in the following mathematical analysis:

$$\frac{T_4}{T_2 + T_3} = \frac{V_{IN}}{V_{REF} + E_{OS}} \qquad \text{Eq. 1}$$

$$\left[\frac{T_8}{T_6 + T_7} = \frac{V_{IN}}{V_{REF} + E_{OS}}\right] \qquad \text{Eq. 2}$$

$$\frac{T_8}{T_6 + T_7} = \frac{V_{IN}}{V_{REF} - E_{OS}}$$

Solving for $(T_4+T_8)$, where $K=(T_2+T_3)=(T_6+T_7)$ $$(T_4 + T_8) = \frac{2\,K\,V_{IN}}{V_{REF}}\left[\frac{1}{1-\left(\frac{E_{OS}}{V_{REF}}\right)^2}\right] \qquad \text{Eq. 3}$$

In many practical dual slope converter designs the offset voltage $E_{OS}$ is on the order of 10 millivolts and the reference voltage $V_{REF}$ is one volt. From equation 3 it can be calculated that the resulting measurement error from these typical values is only 0.01% of reading. Further, that error can nearly always be corrected by an initial scale factor calibration adjustment which is needed in any event to account for other component tolerance effects. A still further advantage of the method and apparatus is that troublesome low frequency semiconductor noise of the integrator amplifier is reduced due to translation of the noise spectrum to a higher frequency band than that utilized in prior dual slope implementations. The noise is moved to a higher frequency due to effectively chopping each signal integrate phase at its midpoint.

Figure 4:
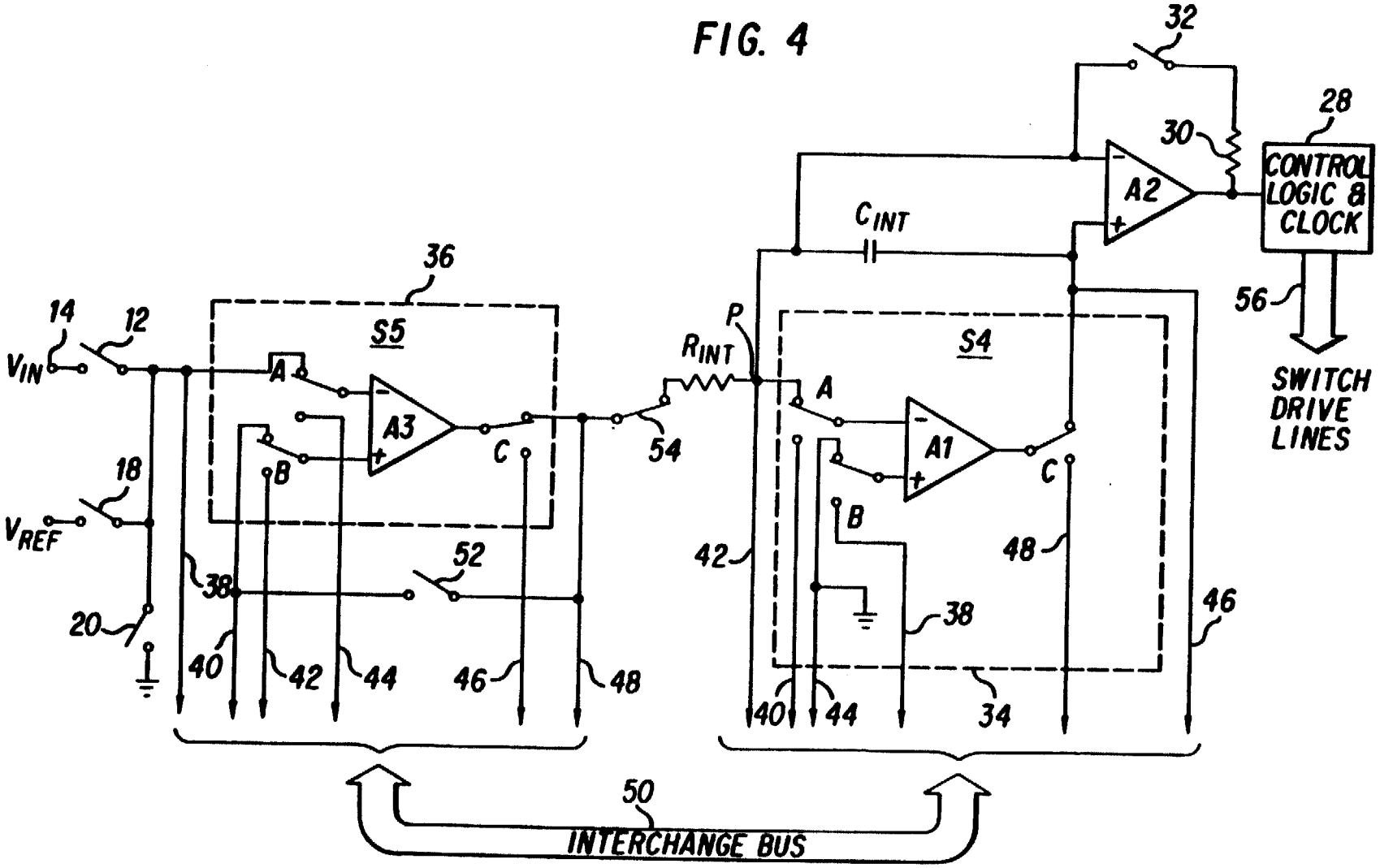
FIG. 4 is a schematic diagram of another preferred embodiment of an A/D converter constructed according to the invention.

Referring to FIG. 4 there is shown a second and preferred embodiment of the invention. In that Figure there is shown a first amplifier A1 in an integrator Op-Amp circuit which includes an integrate capacitor $C_{INT}$ and integrate resistor $R_{INT}$. A comparator Op-Amp A2 is connected across the integrate capacitor $C_{INT}$ and has its output connected to control logic and clock 28. A comparator zeroing loop comprising resistor 30 and switch 32 are connected from the output of the comparator amplifier A2 to its inverting input. A high impedance buffer amplifier A3 is connected between the input of the integrator amplifier A1 and the unknown voltage input terminal 14 to which the voltage $V_{IN}$ is connected for measurement. It will be understood by those skilled in the art that it is desirable to utilize a high impedance buffer at the input of the integrator amplifier to avoid undesirable loading. The prior art circuit of FIG. 1 is shown without such an amplifier for simplicity of illustration and description. However, it will be understood that in normal practice such a buffer amplifier would be utilized.

In FIG. 2 there was described an embodiment of the invention wherein a digital type cancellation of integrator offset was achieved in a digital manner. According to the arrangement and method of that embodiment of the invention this was achieved by in effect reversing the input connections to the integrator amplifier while inverting its output. The embodiment of the invention illustrated in FIG. 4 provides for digital type cancellation of integrator and buffer amplifier offsets in a modified manner which permits elimination of the inverter or Gain −1 Op-Amp 26 used in the embodiment of the invention illustrated in FIG. 2.

According to the preferred embodiment of the invention illustrated in FIG. 4 there is provided in conjunction with the amplifier A1 and amplifier A3 an array of switches to achieve what may be termed an amplifier interchange or swap. According to this embodiment of the invention the switching array is actuated by the control logic 28 to affect a chopping of the integration ramp during the integration of the unknown voltage as is illustrated in FIG. 3 and was described in conjunction with the embodiment of the invention of FIG. 2. This switching has the effect of reversing or interchanging the positions of the amplifiers A1 and A3 at the time of the reversal shown in FIG. 3 at REV.

Referring to FIG. 4 it will be seen that amplifier A1 is provided with a three pole double throw switch S4A, B and C. The amplifier A1 and its switches S4A, B and C constitute switching array 34. Similarly amplifier A3 is provided with a three pole double throw switch S5A, B and C. This switch with amplifier A3 comprises the switching array 36. The movable contact of the switch S4A is connected to the inverting input of the amplifier A1 while the movable contact of the switch S4B is connected to the non-inverting input of amplifier A1. The output of amplifier A1 is connected to the movable contact of switch S4C. The amplifier A3 and its switch S5 are similarly connected. Thus switch S5A has its movable contact connected to the non-inverting input of amplifier A3 while the switch S5B has its movable contact connected to the inverting input of amplifier A3. The output of amplifier A3 is connected to the movable contact of switch S5C. The normally closed contact of switch S5C as shown in FIG. 4 is connected to the integrate resistor $R_{INT}$ which in turn is connected to the normally closed contact of switch S4A feeding the inverting input of amplifier A1. The integration resistor $R_{INT}$ is connected to the integration capacitor $C_{INT}$ at the summing point indicated at P. The normally closed contact of switch S4C is connected to the other terminal of the integration capacitor $C_{INT}$ and to the non-inverting input of the comparator A2.

The various fixed contacts of the switches S4 and S5 are interconnected by leads or connections 38, 40, 42, 44, 46 and 48 through a suitable interchange or swap bus indicated at 50. It will be seen that with the switches S4 and S5 in the positions indicated in FIG. 4 the input of amplifier A3 is connected through S5A and the integrate switch 12 to the input terminal 14. The inverting input of amplifier A3 is connected through switch S5B and feedback switch 52 to the output of amplifier A3 through switch S5C. This output is connected to the integrating resistor $R_{INT}$ through the hold switch 54 which is in a closed position. These switch positions effectively configure A3 as a unity gain, high impedance, buffer amplifier.

Similarly, the switch positions indicated in FIG. 4 effectively configure A1 as an integrating amplifier whose time constant equals $(R_{INT} \times C_{INT})$.

The integration resistor $R_{INT}$ is connected to the inverting input of amplifier A1 through switch S4A. The non-inverting input of the amplifier A1 is connected to common or ground through switch S4B. The output of amplifier A1 is connected through switch S4C to the integrate capacitor $C_{INT}$ and to the non-inverting input of the comparator Op-Amp A2. In this configuration the integrating capacitor $C_{INT}$ will charge during the time period $T_2$ illustrated in FIG. 3 with the offset voltages of amplifiers A1 and A3 being applied in a first direction. This will continue at the ramp slope indicated during $T_2$ until the reversal REV. At the time of reversal and transition from time period $T_2$ to time period $T_3$ the switches S4 and S5 reverse and integrate switch 12 remains closed. The effect of actuation of the reverse switches S4 and S5 is to effectively interchange or swap the positions of the amplifiers A1 and A3.

Integrating capacitor $C_{INT}$ will continue charging through a circuit extending from the input terminal 14 through integrate switch 12, lead 38, interchange bus 50, switch S4A, non-inverting input of amplifier A1 (now acting as a buffer amplifier), output of amplifier A1, switch S4C, lead 48, interchange bus 50, lead 48, hold switch 54, integrate resistor $R_{INT}$, summing point P and integrate capacitor $C_{INT}$. The amplifier A3 at this time is connected as an integrate amplifier with its non-inverting input connected through switch S5A to lead 44, interchange bus 50, and lead 44 to input common or ground. Its inverting input is connected through switch S5B, lead 42, interchange bus 50 and lead 42 to summing point P so that the amplifier is in a high gain state to act as the integration amplifier. Conversely the amplifier A1 has its non-inverting input connected through switch S4B, lead 38, interchange bus 50 and lead 38 so that it now performs as a unity gain high impedance buffer.

With this interchange of amplifiers A1 and A3 at REV the charging of the integration capacitor $C_{INT}$ continues but at a different ramp slope. The interchange of the amplifiers A1 and A3 has placed their offset voltages on opposite sides of the integration resistor $R_{INT}$ and summing point P. As a result their effect on the rate of charge of the integration capacitor in time frame $T_3$ is opposite with respect to each amplifier to that which it had during the time period $T_2$. The result is a digital type cancellation of the effect of the offset error voltage of the amplifiers A1 and A3.

At time period $T_4$ the integrate switch 12 opens, the reference integrate switch 18 closes and the amplifier switches S4 and S5 remain in the position opposite to that shown in FIG. 4. Application of the $V_{REF}$ voltage now causes de-integration as shown by the downward ramp in time period $T_4$ in FIG. 3. During this time period the amplifier A1 is still acting as a buffer amplifier while amplifier A3 is in the integration amplifier configuration. Cross-over or completion of the de-integration is detected by the comparator A2 and the previously described hold period of $T_5$ occurs as switches 18 and 54 are opened.

At the commencement of time period $T_6$ the amplifier switches S4 and S5 remain in the same position which is opposite to that shown in FIG. 4. Switches 12 and 54 close to institute a new charge cycle for the integration capacitor $C_{INT}$. The charge occurs through the amplifiers A2 and A3 in the same interchanged position just described for time periods $T_3$ and $T_4$. This results in creation of the ramp shown in time period $T_6$ in FIG. 3. The net system offset (due to amplifiers A1 and A3) at this time is the same as it was during time periods $T_3$ and $T_4$ in the first cycle.

At the reversal point REV the amplifiers A1 and A3 are again interchanged through actuation of the amplifier switches S4 and S5 so that those switches return to the position indicated in FIG. 4. The amplifier A3 is now again acting as a unity gain high impedance buffer amplifier and amplifier A1 is acting as a high gain integration amplifier. The respective offset voltages of the two amplifiers have now again been moved to opposite sides of the summing point P so that the effect on the slope of the charging ramp is reversed as shown in the time period $T_7$ in FIG. 3. This state continues until transition between time periods $T_7$ and $T_8$ whereupon switch-over to reference integration or de-integration occurs as indicated in time period $T_8$ in FIG. 3. The amplifier switches S4 and S5 remain unchanged during this transition from $T_7$ to $T_8$ and the slope of the de-integrate ramp as seen in FIG. 3 is different than the corresponding ramp during time period $T_4$.

The offset voltages act in exactly opposite and cancelling polarities in time frames $T_4$ and $T_8$ to effect substantial cancellation of the reference de-integration offset voltages during the occurrence of two cycles. The operation of this embodiment is accordingly pursuant to equations 1 through 3. The embodiment of the invention illustrated in FIG. 4 thus achieves the same digital type cancellation of amplifier offset as the embodiment of FIG. 1 but eliminates the necessity for the inverter Op-Amp 26. It will be understood that the actuation of the various switches is performed under control of the control logic 28 via a switch drive line bus 56.

Figure 5:
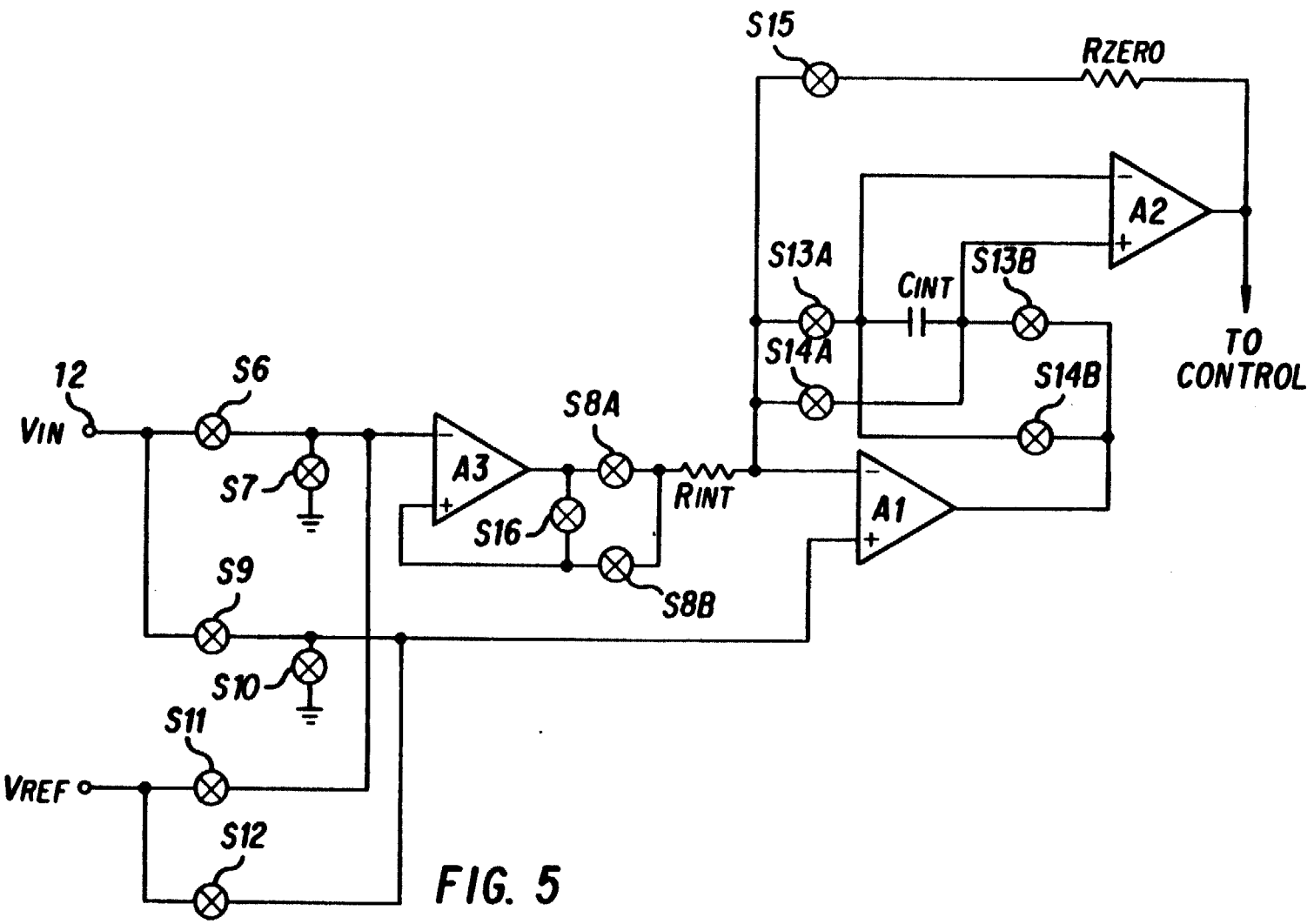
FIG. 5 is a schematic diagram of a further preferred embodiment of an A/D converter constructed according to the invention.

Referring to FIG. 5 there is shown a further preferred embodiment of the invention capable of performing the same offset cancellation of the embodiments of FIGS. 2 and 4 but with simplified switching circuitry. According to the embodiment of the invention illustrated in FIG. 5 switching is provided to interchange or reverse connection of the integrating capacitor without the necessity for electrical interchange of the buffer and integrator amplifiers. This requires somewhat less switching circuitry and is advantageous in that regard.

Referring to FIG. 5 there is shown an A/D converter comprising an integrator amplifier A1, comparator A2 and buffer amplifier A3. The buffer amplifier A3 has its non-inverting input connectible to the unknown voltage input terminal 12 through switch S6 and is connectible to common or ground through switch S7. The output of buffer amplifier A3 is connectible to the integration resistor $R_{INT}$ and into a feedback loop through switches S8A and B respectively. The feedback loop from the output of buffer amplifier A3 to its inverting input may also be closed through switch S16.

The integrator amplifier A1 has its inverting input connected to the integrating resistor $R_{INT}$ and has its non-inverting input connectible through switch S9 to unknown voltage input terminal 12. The non-inverting input of amplifier A1 is also connectible through switch S10 to common or ground. The reference voltage $V_{REF}$ is connectible to the non-inverting inputs of the buffer and integrator amplifiers A3 and A1 through switches S11 and S12 respectively.

The integrating capacitor $C_{INT}$ is connectible across the inverting input and the output of the integrating amplifier A1 in a first direction through switches S13A and B and in an opposite direction through switches S14A and B. The terminals of the integrating capacitor $C_{INT}$ are directly connected to the inputs of comparator A2. The output of comparator A2 is connected to a zeroing circuit comprising switch S15 and resistor $R_{ZERO}$. The output of the comparator is also connected to the control logic in the manner described in connection with the preceding embodiments of the invention.

The operation of this embodiment of the invention effectuates integration and de-integration and chopping of the integrate phase to achieve the error cancellation in the manner illustrated by the wave forms in FIG. 3. Referring to FIGS. 3 and 5, the integration period $T_2$ is initiated with switches S6, S13 A and B, S10 and S8A and B closed. All other switches are open. In this configuration the unknown voltage is inputted to the non-inverting input of buffer amplifier A3 and then connected through switch S8A to the integrating resistor $R_{INT}$ and integrating capacitor $C_{INT}$ through switches S13A and B. The integrating capacitor in turn is connected from the inverting input of the integrating amplifier A1 to its output through switches S13A and S13B. The integrating capacitor $C_{INT}$ charges as shown in FIG. 3 during period $T_2$. At this time the signal or unknown voltage causes current to flow through the integrating resistor $R_{INT}$ into the integrating capacitor $C_{INT}$ in a first direction. Also the offset voltages of the integrating and buffer amplifiers A1 and A3 cause current flow in a first direction. The total current flow caused by the signal to be determined and the offset voltages determines the slope of the ramp during the time period $T_2$ in FIG. 3. At the mid point REV of the capacitor charging cycle the previously closed switches S6, S10 and S13A and B are opened and switches S9, S7 and S14A and B are closed.

With the circuit disposed in this configuration the unknown voltage at terminal 12 is inputted directly to the non-inverting input of amplifier A1 and causes a reversal of the unknown signal current flow in integrate resistor $R_{INT}$. However this reversal is not seen by the integrate capacitor $C_{INT}$ with respect to the unknown signal current because the connection of the capacitor is reversed with respect to the amplifier A1. On the other hand the current flow due to the amplifier offset voltages is reversed at the summing point P so that the effect of such offset voltages is cancelled during the integrate cycle occurring during time periods $T_2$ and $T_3$ and $T_6$ and $T_7$. The reversal of the current flow due to the offset voltages during periods $T_4$ and $T_8$ is cancelled by totalling the result of two cycles as discussed previously and as analyzed in the foregoing equations 1-3.

Comparator zeroing is accomplished during the time period $T_1$ by closing the switch S15 while switches S13A and B are closed and switches S8A and B are open. Similarly the hold time period $T_5$ is effected by opening switches S8A and B and simultaneously closing S16 in order that A3 by maintained in a closed-loop configuration.

Figure 6:
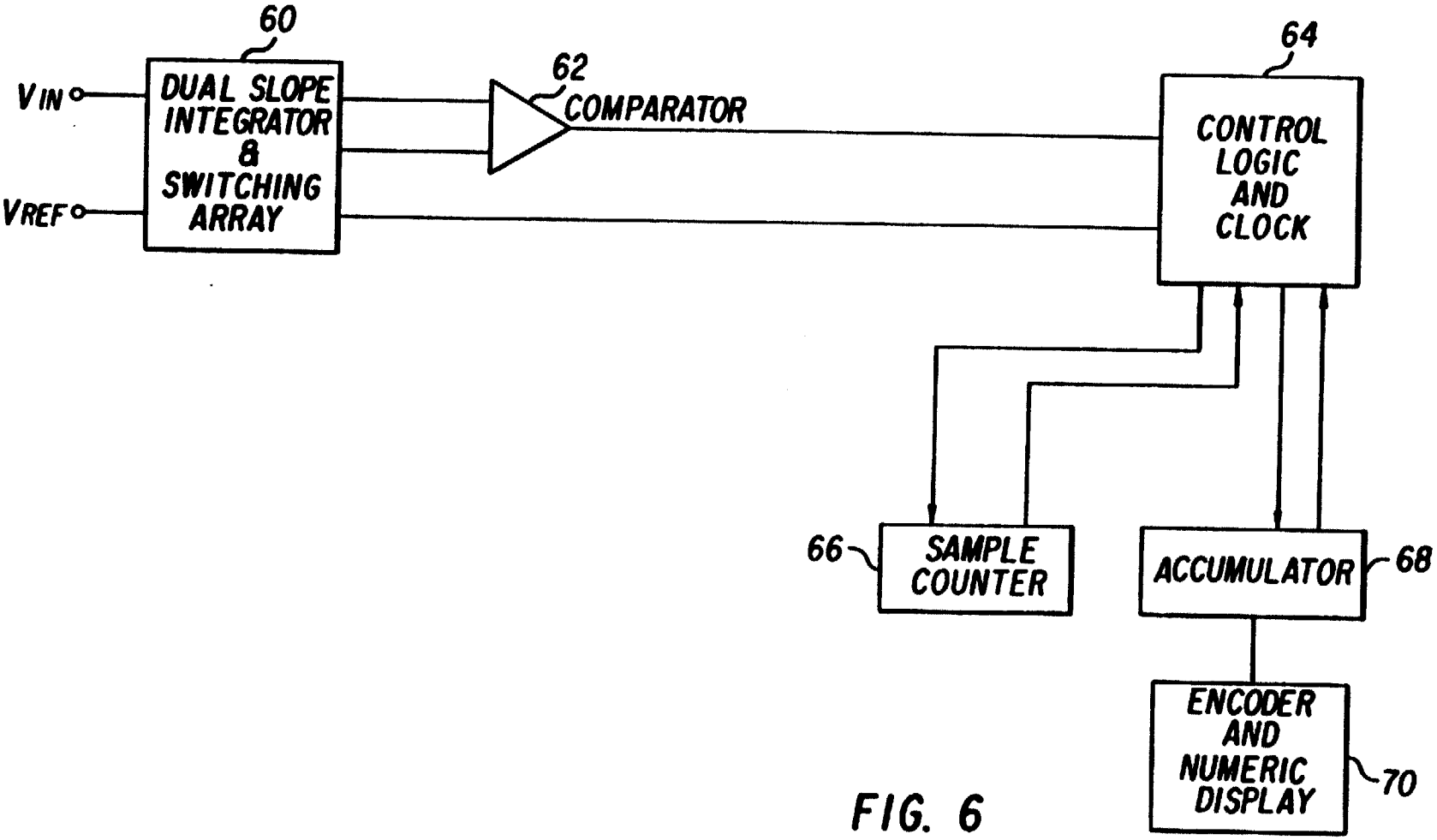
FIG. 6 is a simplified diagram of an A/D converter constructed according to the invention in an application wherein it produces a numeric digital display.

The method and apparatus of the invention may be used in a wide variety of applications as will be apparent to those skilled in the art. FIG. 6 illustrates in simplified diagrammatic form a digital indicating instrument utilizing the improved A/D converter of the invention. Referring to that Figure there is seen a dual slope integrator and switching array 60 having connections for an analog voltage $V_{IN}$ to be measured and a reference voltage $V_{REF}$. The integrator provides an output to a comparator 62 which is connected to a control logic and clock unit 64 in the manner described in connection with the preceding embodiments of the invention. The clock pulses occurring during the de-integrate cycles for at least two consecutive cycles are counted and stored in the sample counter and these are then accumulated or summed in accumulator 68 as described for example in assignee's U.S. Pat. No. 4,556,867. The accumulator 68 provides an input to a decoder and numeric display 70 which produces a visible digital indication of the analog input $V_{IN}$.

It will be apparent from the foregoing that there is provided by the invention an improved integrating A/D converter and method of conversion wherein error signal is eliminated or minimized in digital fashion.

The invention may be embodied in other specific forms without departing from the spirit or essential characteristics thereto. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. An integrating analog-to-digital converter comprising amplifier means *for integrating* coupled to [impedance] means *for providing an impedance*; means for connecting an analog signal to said amplifier means to cause current flow to said [impedance] means *for providing impedance* for a predetermined time period to cause the potential across said [impedance] means *for providing impedance* to vary between a first level and a second level dependent on the value of said analog signal; means to provide a digital output signal which is a function of the difference between said first and second levels; said amplifier means having associated therewith amplifier offset potential which affects the difference between said first and second levels for a given predetermined time period; switching means for reversing [the] *a* relative polarity of said *amplifier* offset potential with respect to said [impedance] means *for providing impedance* during a portion of said predetermined time period; said *amplifier* offset potential during said portion of time during which it is reversed affecting said difference between said first and second levels in a direction opposite to which said *amplifier* offset potential affects said difference between said first and second levels when it is not reversed, whereby the net affect of said *amplifier* offset potential on said difference in said first and second levels over a given predetermined time period is substantially cancelled.

2. An integrating analog-to-digital converter according to claim 1 wherein said means to provide a digital output signal comprises means to reduce the potential across said [impedance] means *for providing impedance* from said second level to said first level and provide a digital signal representative of the time required to reduce said potential from said second level to said first level; said amplifier offset potential affecting said time to reduce said potential from said second to said first level; said switching means including means to reverse the relative polarity of said *amplifier* offset potential with respect to said [impedance] means *for providing impedance* during consecutive cycles of decreasing the potential across said [impedance] means *for providing impedance* from said second level to said first level whereby the effect of said *amplifier* offset potential on said time to reduce said potential from said second to said first level is substantially self-cancelling in a summation of *said digital signal provided from* two *said* consecutive cycles *of decreasing the potential across said means for providing impedance.*

3. A converter according to claim 2 wherein the potential across said [impedance] means *for providing impedance* is decreased from said second level to said first level at a first rate during a first cycle and is reduced at a second different rate during a second cycle during which said relative polarity of said offset potential with respect to impedance is reversed during the reduction of said potential from said second to said first level.

4. A converter according to claim 2 including means for summing *said digital signal provided from* consecutive cycles of decreasing the potential across said [impedance] means *for providing impedance* from said second to said first level to provide said digital output signal.

5. A converter according to claim 1 wherein the portion of said predetermined time period during which the relative polarity of said *amplifier* offset potential is reversed with respect to said [impedance] means *for providing impedance* is equal to substantially one-half said predetermined time period.

6. A converter according to claim 1 wherein the potential across said [impedance] means *for providing impedance* increases at a first rate during a first portion of said predetermined time period and at a second different rate during the remainder of said predetermined time period.

7. A device according to claim 1 wherein said means to reverse the relative polarity of said *amplifier offset* potential with respect to said [impedance] means *for providing impedance* comprises switching means to reverse the input connections to said amplifier means, and means to invert the output of said amplifier means during said portion of said predetermined time period.

8. A converter according to claim 1 wherein said amplifier means comprises a buffer amplifier [means] and an integrator amplifier [means]; said [impedance] means *for providing impedance* being connected across an input of said integrator amplifier [means] and its output; and *a* resistor [means] connected between said input of said integrator amplifier [means] and the output of said buffer amplifier [means]; said switching means including means for interchanging said buffer amplifier [means] and said integrator amplifier [means] during said portion of said predetermined time period.

9. A converter according to claim 1 wherein said amplifier means includes buffer amplifier [means] and integrator amplifier [means]; said [impedance] means *for providing impedance* being connected from an input to said integrator amplifier [means] and to the output of said integrator amplifier [means]; and *a* resistor [means] connected between the output of said buffer amplifier [means] and said [impedance] means *for providing impedance*; said switching means including means for reversing the connections of said [impedance] means *for providing impedance* to said input and output of said integrator amplifier [means] during said portion of said predetermined time period.

10. A converter according to claim 1 including comparator means connected to said [impedance] means *for providing impedance* for providing an output signal when the potential across said [impedance] *means for providing impedance* is reduced from said second level to a predetermined level, and means for zeroing said comparator means prior to the commencement of a said predetermined time period.

11. An integrating analog-to-digital converter comprising: amplifier means *for integrating* coupled to [capacitor] means *for providing capacitance*; [analog signal input] means *for inputting an analog signal*; control means for: (a) connecting said [analog signal input] means *for inputting an analog signal* to said [capacitor] means *for providing capacitance* for a first predetermined period of time to cause a first current to charge said [capacitor] means *for providing capacitance*, said first current being a function of the level of said analog signal and the level of error signal in said amplifier means, and (b) connecting said [analog signal input] means *for inputting an analog signal* to said [capacitor] means *for providing capacitance* for a second predetermined period of time to cause a second different current to charge said [capacitor] means *for providing capacitance*, said second current being a function of the level of said analog signal and an invert of the level of error signal in said amplifier means, whereby the average charging current over the first and second *predetermined* periods of time is a function of the level of said analog signal substantially unaffected by the level of said error signal; and means to provide a digital output signal which is a function of said average charging current.

12. An integrating analog-to-digital converter according to claim 11 wherein said means to provide a digital output signal includes means responsive to said control means to discharge said [capacitor] means *for providing capacitance* at the termination of said first and second predetermined [time] periods *of time*; said [capacitor] means *for providing capacitance* discharging at a rate which is a function of the charge in said [capacitor] *means for providing capacitance* and said level of error signal; *and* said control means being effective to cause at least two cycles of charge and discharge of said [capacitor] means *for providing capacitance* and to cause said [capacitor] means *for providing capacitance* to discharge at a first current in a first of two consecutive cycles and at a second different current in a second cycle following said first of two consecutive cycles, the first current being a function of the charge of said [capacitor] means *for providing capacitance* and the level of said error signal and the second current being a function of the charge of said [capacitor] means for providing capacitance and an invert of the level of said error signal, *and* said digital output [means providing a digital] signal [which is] *being* a function of the charge of said [capacitor] *means for providing capacitance* substantially unaffected by the level of said error signal.

13. A dual slope analog to digital converter comprising: amplifier means *for integrating* coupled to [capacitor] means *for providing capacitance*; means for connecting an analog signal to said amplifier means to cause a current which is a function of the level of said analog signal to charge said [capacitor] means *for providing capacitance* for a predetermined time period; means for connecting a reference signal to said amplifier means to cause a constant current to discharge said [capacitor] means *for providing capacitance* for a time period which is a function of the charge stored by said [capacitor] *means for providing capacitance* during said predetermined time period; said amplifier means having offset potential associated therewith, said offset potential affecting said charging current and said discharging current; and switching means to reverse the direction of effect of said offset potential on the charging current during the charging of said [capacitor] means *for providing capacitance* so that the [capacitor] means *for providing capacitance* is charged at a first higher rate during one portion of said time period and at a second lower rate during a second portion of said time period such that the average charging current is substantially unaffected by said offset potential[,]; and means for providing a digital output signal which is a function of said charge by said [capacitor] means *for providing capacitance* during said predetermined period of time.

14. A dual slope analog-to-digital converter according to claim 13 wherein said switching means includes means to reverse the direction of effect of said offset potential on the discharge current of said [capacitor] means *for providing capacitance* during consecutive cycles of discharge such that the average discharge current for consecutive discharge cycles of said [capacitor] means *for providing capacitance* is substantially unaffected by said offset potential.

15. A dual slope analog-to-digital converter according to claim 13 wherein said switching means includes means to reverse the direction of effect of said offset potential on the sum of the time periods to discharge said [capacitor] means *for providing capacitance* during consecutive discharge cycles.

16. A method of analog-to-digital conversion comprising the steps of:

charging a capacitor for substantially one-half of a predetermined time period with a current which is a function of the level of an analog signal and the level of an error signal;

charging said capacitor for the remainder of said predetermined time period with a current which is a function of said level of said analog signal and the invert of the level of said error signal so that said capacitor reaches a level of charge which is a function of said level of said analog signal substantially unaffected by the level of said error signal;

discharging said capacitor at a rate which is a function of a reference voltage; and producing a digital signal which is a function of the time required to discharge said capacitor.

17. A method of analog-to-digital conversion comprising the steps of:

charging a capacitor for substantially one half of a first predetermined time period with a current which is a function of the level of an analog signal and the level of an error signal;

charging said capacitor for the remainder of said predetermined first time period with a current which is a function of said level of said analog signal and the invert of the level of said error signal so that said capacitor reaches a level of charge which is a function of said level of said analog signal substantially unaffected by the level of said error signal;

discharging said capacitor at a first rate of discharge which is a function of a reference voltage and the level of said error signal;

charging said capacitor for substantially one-half of a predetermined second time period with a current which is a function of the level of said analog signal and the level of said error signal;

charging said capacitor for the remainder of said predetermined second time period with a current which is a function of said level of said analog signal and the invert of the level of said error signal so that said capacitor reaches a level of charge which is a function of said level of said analog signal substantially unaffected by said error signal;

discharging said capacitor at a second rate of discharge which is a function of said reference voltage and the invert of the level of said error signal; and producing a digital signal which is a function of the time required to discharge said capacitor said first and second times.

* * * * *